(12) United States Patent
Liu

(10) Patent No.: US 7,548,426 B2
(45) Date of Patent: Jun. 16, 2009

(54) HEAT DISSIPATION DEVICE WITH HEAT PIPES

(75) Inventor: Peng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 28 days.

(21) Appl. No.: 11/767,051

(22) Filed: Jun. 22, 2007

(65) Prior Publication Data
US 2008/0316707 A1 Dec. 25, 2008

(51) Int. Cl.
*H05K 7/20* (2006.01)
(52) U.S. Cl. ............... 361/700; 361/704; 257/715; 174/15.2; 165/104.21; 165/80.4; 165/185
(58) Field of Classification Search ............ None
See application file for complete search history.

(56) References Cited

U.S. PATENT DOCUMENTS

| | | | | |
|---|---|---|---|---|
| 6,808,013 | B2 * | 10/2004 | Lai et al. | 165/80.4 |
| 7,051,792 | B2 * | 5/2006 | Lee et al. | 165/104.21 |
| 7,089,999 | B1 * | 8/2006 | Wu et al. | 165/80.3 |
| 7,100,681 | B1 * | 9/2006 | Wu et al. | 165/104.33 |
| 2006/0104032 | A1 * | 5/2006 | Lee et al. | 361/700 |
| 2007/0000646 | A1 * | 1/2007 | Chen et al. | 165/104.33 |
| 2007/0006997 | A1 * | 1/2007 | Hsieh | 165/104.33 |
| 2007/0137846 | A1 * | 6/2007 | Wang et al. | 165/177 |
| 2007/0147006 | A1 * | 6/2007 | Peng | 361/709 |
| 2007/0217153 | A1 * | 9/2007 | Lai et al. | 361/700 |
| 2007/0267177 | A1 * | 11/2007 | Lin et al. | 165/104.21 |
| 2007/0267181 | A1 * | 11/2007 | Lin et al. | 165/104.33 |
| 2008/0028610 | A1 * | 2/2008 | Chen | 29/890.03 |
| 2008/0047693 | A1 * | 2/2008 | Chen | 165/104.33 |

FOREIGN PATENT DOCUMENTS

CN 101115368 A * 7/2006

* cited by examiner

*Primary Examiner*—Boris L Chervinsky
(74) *Attorney, Agent, or Firm*—Frank R. Niranjan

(57) ABSTRACT

A heat dissipation device includes a base (14) for absorbing heat from an electronic device and a plurality of fins (20) arranged on the base. A heat pipe (32) thermally contacts the fins and the base for transferring heat from the base to the fins. The heat pipe includes a U-shaped section thermally mounted below the base for absorbing the heat from the electronic device, two straight sections thermally engaging with the fins, and two arced sections interconnecting the U-shaped section and corresponding straight sections. The heat pipe is integrally formed by bending a straight heat pipe and functions as two U-shaped, individual heat pipes.

19 Claims, 3 Drawing Sheets

HEAT DISSIPATION DEVICE WITH HEAT PIPES

BACKGROUND OF THE INVENTION

1. Field of the Invention

The present invention relates to a heat dissipation device adapted for removing heat from electronic devices, and more particularly to a heat dissipation device incorporating heat pipes for improving heat dissipation efficiency of the heat dissipation device.

2. Description of Related Art

During operation of an electronic device such as computer central processing units (CPUs), solid-state circuits, and light emitting diode (LED) display units, a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device may incorporate a plurality of heat pipes. The heat dissipation device further comprises a base for contacting an electronic device and a plurality of fins arranged on the base. The base defines a plurality of grooves therein. The fins cooperatively define a plurality of through holes therein. Each heat pipe has a substantially straight evaporating section received in a corresponding groove of the base, a straight condensing section received in a corresponding through hole of the fins. The heat generated by the electronic device is absorbed by the base, and transferred from the base to the fins via the heat pipes, and finally dissipated from the fins to ambient air. However, in order to improve heat dissipation efficiency of the heat dissipation device, the number of the heat pipes is increased, which accordingly increases the cost of the heat dissipation device.

What is needed, therefore, is a heat dissipation device which has a greater heat-transfer capability and a low cost.

SUMMARY OF THE INVENTION

A heat dissipation device includes a base for absorbing heat from an electronic device and a plurality of fins arranged on the base. A heat pipe thermally contacts the fins and the base for transferring heat from the base to the fins. The heat pipe includes a U-shaped section thermally attached on a bottom face of the base, two straight sections thermally engaging with the fins, and two arced sections interconnecting the U-shaped section and corresponding straight sections. The heat pipe functions as two individual heat pipes but has a lower cost than that of the two individual heat pipes.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
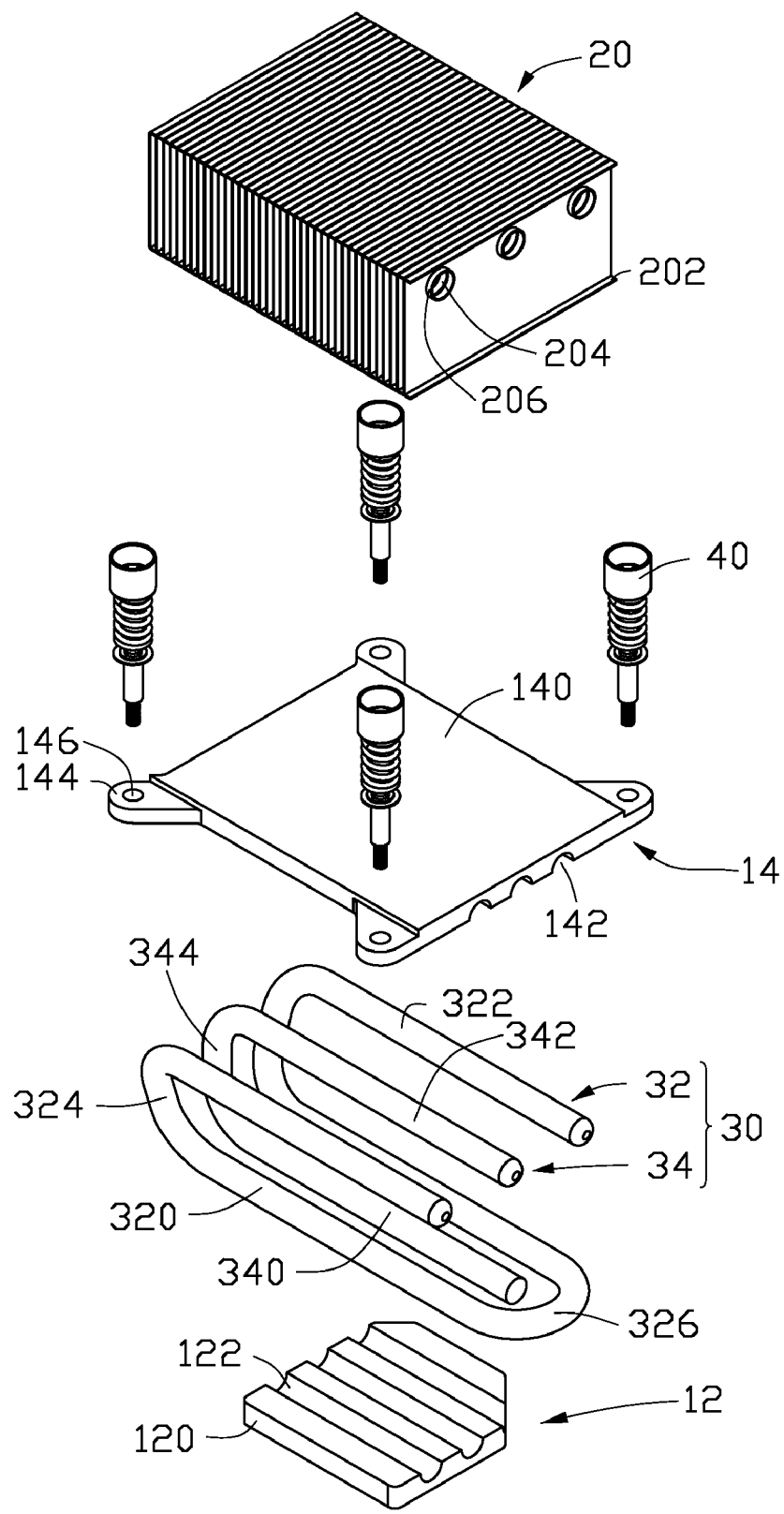
FIG. 1 is an exploded, isometric view of a heat dissipation device in accordance with a preferred embodiment of the present invention.

Referring to FIG. 1, a heat dissipation device of a preferred embodiment of the invention is used for dissipating heat from an electronic component (not shown) mounted on a printed circuit board (not shown). The heat dissipation device comprises a heat absorbing plate 12, a base 14 attached on the heat absorbing plate 12, a plurality of fins 20 arranged on the base 14, and a heat pipe assembly 30 thermally contacting the heat absorbing plate 12, the base 14 and the fins 20.

Both of the heat absorbing plate 12 and the base 14 have good heat conductivity. The heat absorbing plate 12 comprises a main body 120 that is a square body having two neighboring corners perpendicularly cut off. Three parallel grooves 122 are defined at a top face of the main body 120. A bottom face of the main body 120 of the heat absorbing plate 12 thermally contacts with the electronic component for absorbing heat generated thereby. The base 14 mounted on the heat absorbing plate 12, comprises a rectangular body 140 having a larger area than that of the main body 120 of the heat absorbing plate 12, for evenly transferring heat absorbed by the heat absorbing plate 12 to the base 14. A bottom face of the rectangular body 140 of the base 14 thermally contacts with the top face of the heat absorbing plate 12. Three parallel grooves 142 are defined at the bottom face of the rectangular body 140 corresponding to the three grooves 122 of the heat absorbing plate 12. The rectangular body 140 of the base 14 forms four ears 144 extending horizontally and outwardly from four corners thereof. Each ear 144 defines a through hole 146 therein for providing a passage of a screw 40 to attach the base 14 to the printed circuit board.

The fins 20 are arranged thermally on a top face of the base 14 for dissipating heat absorbed by the base 14 and the heat absorbing plate 12. Each of the fins 20 is substantially rectangular and is made from a metal sheet. Each fin 20 defines three evenly spaced through holes 204 at an upper portion thereof. Each of the through holes 204 has its respective sidewall 206 that is formed during punching of its respective through hole 204. The sidewalls 206 connect correspondingly with each other to define three channels in the fins 20. A pair of flanges 202 is formed perpendicularly at an upper edge and a lower edge of each fin 20 in a manner such that each flange 202 extends along the same direction as the sidewall 206. Corresponding flanges 202 of the fins 20 cooperate to define an upper face and a lower face of the fins 20, wherein the lower face of the fins 20 thermally contacts with the top face of the base 14 by soldering.

The heat pipe assembly 30 comprises a first heat pipe 32 and a second heat pipe 34, both of which are round in cross section and have the same diameter. Furthermore, the first and second heat pipes 32, 34 are each integrally formed by bending a straight heat pipe. The first heat pipe 32 comprises two parallel evaporating sections 320 connecting to each other with an arced connecting section 326 therebetween to form a U-shaped configuration, two condensing sections 322 located above and parallel to the evaporating sections 320, and two arced adiabatic sections 324 interconnecting corresponding evaporating sections 320 and the condensing sections 322, respectively. The evaporating sections 320 and the condensing sections 322 respectively define two horizontals parallel to the base 14. A plane defined by one of the adiabatic sections 324 is oriented at an acute angle to another plane defined by the other one of the adiabatic sections 324, whereby a distance between the two condensing sections 322 is larger than that between the two evaporating sections 320. Heat brought by the first heat pipe 32 can be transferred to two lateral sides of the fins 20, to thereby evenly distribute over the fins 20. Due to the two evaporating sections 320 which absorb heat from the heat absorbing plate 12, a heat exchange dose not exist between the evaporating sections 320. In other words, the connecting section 326 cannot transfer heat from an evaporating section 320 to another evaporation section 320. The first pipe 32 actually functions as two U-shaped, individual heat pipes to transfer an amount of heat from the heat absorbing plate 12 and the base 14 to the fins 20 which is equal to that achievable by the two U-shaped, individual heat pipes. However, the cost for manufacturing the first heat pipe 32 is lower that that for manufacturing the two U-shaped, individual heat pipes.

The second heat pipe 34 comprises an evaporating portion 340, a condensing portion 342 located above the evaporating portion 340, and an arced adiabatic portion 344 connecting the evaporating portion 340 with the condensing portion 342. The condensing portion 342 is so oriented parallel to the evaporating portion 340 as to make the second heat pipe 34 to form a U-shaped configuration. The condensing portion 342 of the second heat pipe 34 is located between and parallel to the two condensing sections 322 of the first heat pipe 32 with the condensing portion 342 of the second heat pipe 34 being positioned in the common horizontal defined by the two condensing sections 322 of the first heat pipe 32. The evaporating portion 340 of the second heat pipe 34 is located between the two evaporating sections 320 of the first heat pipe 32 with the evaporating portion 340 of the second heat pipe 34 being positioned in another horizontal defined by the two evaporating sections 320 of the first heat pipe 32. The adiabatic portion 344 of the second heat pipe 34 is located between the two adiabatic sections 324 of the first heat pipe 32, wherein a plane defined by the adiabatic portion 344 of the second heat pipe 34 is perpendicular to the base 14. The first heat pipe 32 and the second heat pipe 34 cooperatively form the heat pipe assembly 30 in such foresaid manner that two lateral portions of the first heat pipe 32 is symmetrical about the second heat pipe 34.

Figure 2:
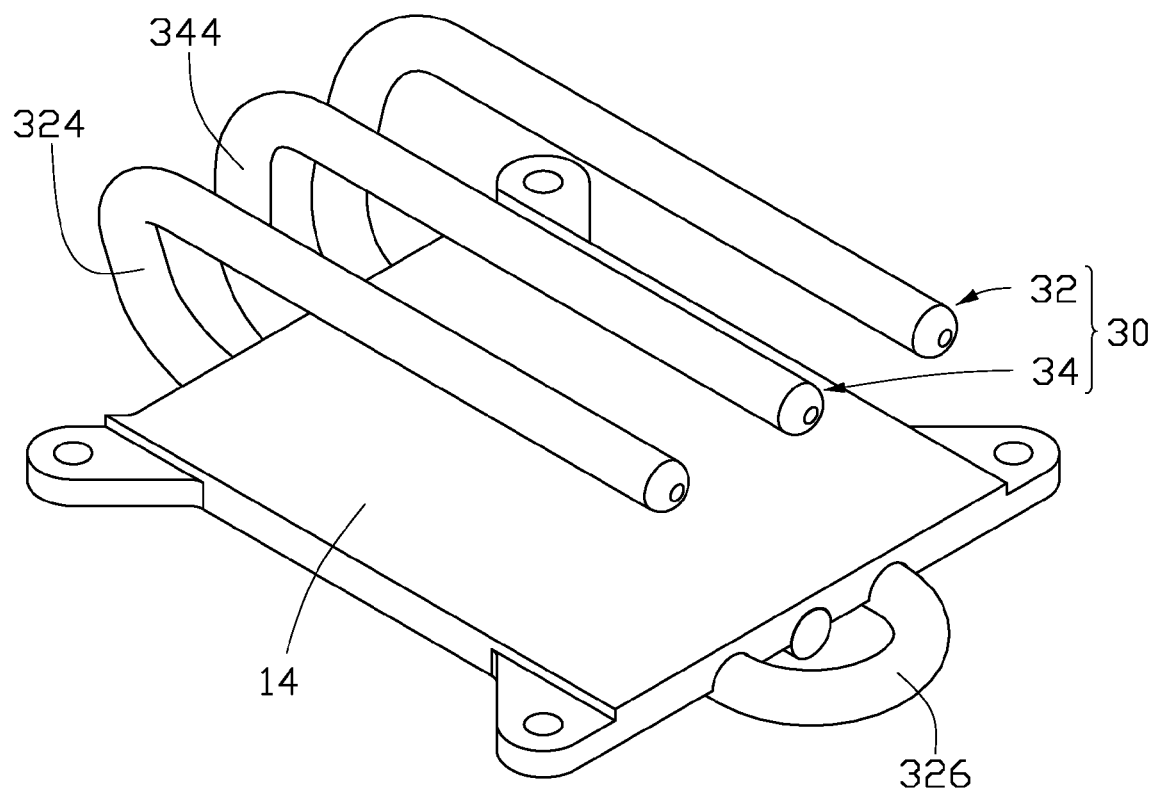
FIG. 2 is an enlarged assembled view of heat pipes, a base and a heat absorbing plate of the heat dissipating device of FIG. 1.
Figure 3:
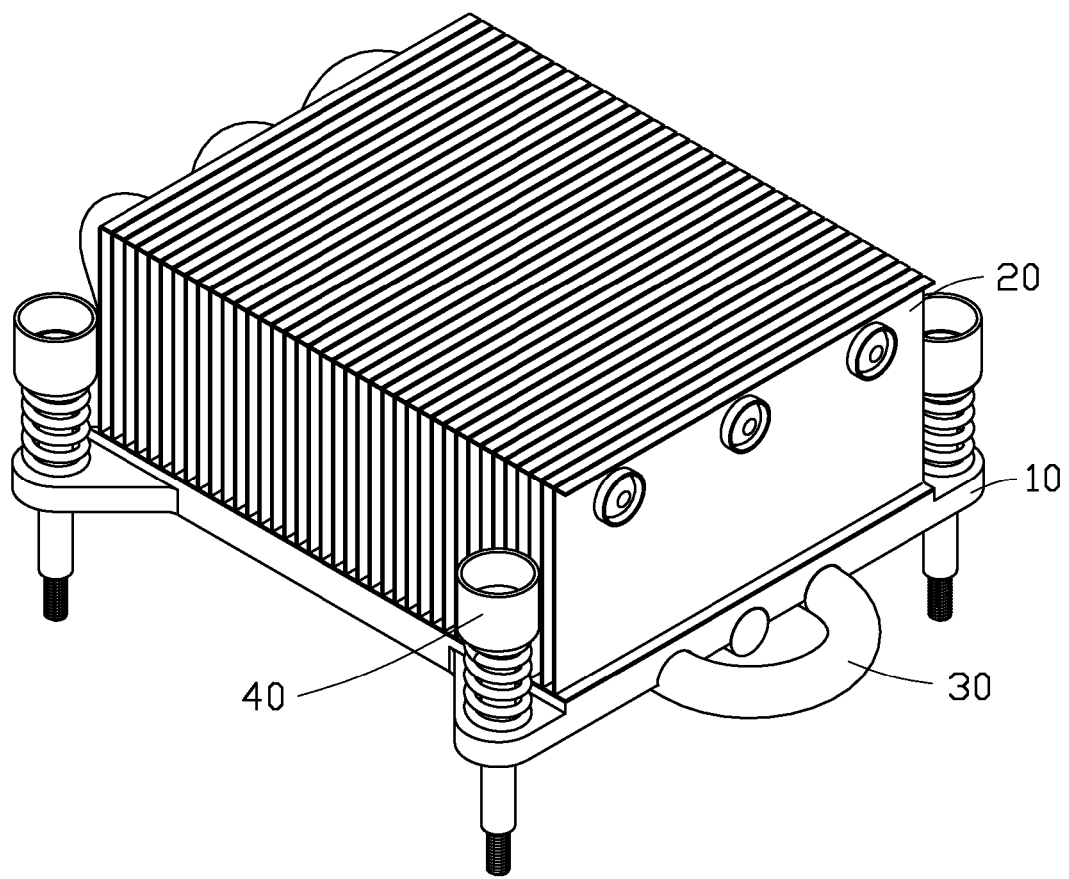
FIG. 3 is an enlarged assembled view of FIG. 1.

As shown in FIGS. 1-3, the evaporating sections 320 and the evaporating portion 340 of the heat pipe assembly 30 are accommodated in the grooves 122 of the heat absorbing plate 12 with the condensing sections 322 and the condensing portion 342 of the heat pipe assembly 30 being positioned above the heat absorbing plate 12. The base 14 is disposed on the heat absorbing plate 12 to have a thermal contact therewith, wherein the grooves 142 of the base 14 and corresponding grooves 122 of the heat absorbing plate 12 cooperate to define three cylinder channels to substantially receive the evaporating sections 320 and the evaporating portion 340 of the heat pipe assembly 30 therein. The adiabatic sections 324 and the adiabatic portion 344 of heat pipe assembly 30 extend upwardly away from the heat absorbing plate 12 and are located at a lateral side of the base 14. The connecting section 326 of the heat pipe assembly 30 projects outwardly and horizontally in respect to the base 14, and is located at an opposite lateral side of the base 14. The condensing sections 322 and the condensing portion 342 of the heat pipe assembly 30 extend through corresponding holes 204 of the fins 20 from the lateral side of the fins 20, and are soldered in the holes 204 so that the condensing sections 322 and portion 342 of the heat pipe assembly 30 are thermally connected with the fins 20. The bottom face of the fins 20 is soldered onto the top face of the base 14.

In use of the heat dissipation device of this embodiment of the invention, the heat absorbing plate 12 absorbs heat from the electronic device. A portion of the heat in the heat absorbing plate 12 is absorbed by the evaporating sections 320 and evaporating portion 340 of the heat pipe assembly 30 and is transferred to the fins 20 via the adiabatic sections 324, the adiabatic portion 344, the condensing sections 322, and the condensing portion 342 of the heat pipe assembly 30. The other portion of the heat in the heat absorbing plate 12 is transferred directly to the fins 20 via the base 14. The heat in the fins 20 is subsequently dissipated to ambient air.

The heat dissipation device of the invention has the first heat pipe 32 which is integrally formed by bending a single heat pipe and can function to achieve the heat transfer effectiveness as two individual heat pipes, whereby the cost of the heat dissipation device can be lowered. Since the distance between the two condensing sections 322 is more than that between the two evaporating sections 320 of the first heat pipe 32, the heat absorbing by the heat absorbing plate 12 can be transferred to the two lateral portions of the fins 20 and dispersed evenly over the fins 20. Furthermore, the heat can be brought much rapidly to the fins 20 by adding the second heat pipe 34 between two lateral portions of the first heat pipe 32. Comparing to conventional heat dissipation device, the heat dissipation device of the present invention has a lower cost and an improved heat dissipation efficiency.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, the heat dissipation device comprising:
    a base for absorbing heat from the electronic device;
    a plurality of fins arranged on a top face of the base; and
    a heat pipe thermally contacting the fins and the base for transferring heat from the heat generating electronic device to the fins, the heat pipe comprising two parallel evaporating sections connecting with each other and contacting thermally with a bottom face of the base, two parallel condensing sections located above the evaporating sections and extending through the fins, and two adiabatic portions interconnecting the evaporating sections and corresponding condensing sections.

2. The heat dissipation device of claim 1, wherein a heat absorbing plate is attached thermally to the base at the bottom face thereof with the evaporating sections of the heat pipe being sandwiched between the base and the heat absorbing plate.

3. The heat dissipation device of claim 1, wherein the evaporating sections and the condensing sections are oriented parallel to each other.

4. The heat dissipation device of claim 3, wherein the evaporating sections are located in a horizontal plane parallel to another horizontal plane defined by the two condensing sections, the horizontal plane is parallel to the base.

5. The heat dissipation device of claim 4, wherein an arced connecting section interconnects the two evaporating sections to form a U-shape.

6. The heat dissipation device of claim 5, wherein a distance between the two evaporating sections is less that between the two condensing sections in a manner such that two planes defined by the two adiabatic sections define an acute angle therebetween.

7. The heat dissipation device of claim 5 further comprising an additional heat pipe, wherein the additional heat pipe comprises an evaporating portion sandwiched between the base and the heat absorbing plate, a condensing portion located above the evaporating portion and extending through the fins, and an arced adiabatic portion connecting the condensing portion and the evaporating portion.

8. The heat dissipation device of claim 7, wherein the evaporating portion of the additional heat pipe is located between the two evaporating sections of the heat pipe, the condensing portion of the additional heat pipe is located between the two condensing sections of the heat pipe in such a manner that the heat pipe is distributed symmetrically with respect to the additional heat pipe.

9. The heat dissipation device of claim 8, wherein the condensing sections of the heat pipe and the condensing portion of the additional heat pipe are located above the base for engaging with the fins, the adiabatic sections of the heat pipe and the adiabatic portion of the additional heat pipe are located at a lateral side of the base, and the connecting section of the heat pipe projects from another lateral side of the base.

10. The heat dissipation device of claim 9, wherein the condensing sections of the heat pipe and the condensing portion of the additional heat pipe are parallel to each other and in the another horizontal plane, the evaporating sections of the heat pipe and the evaporating portion of the additional heat pipe are parallel to each other and in the horizontal plane, a plane defined by the adiabatic section of the additional heat pipe is perpendicular to the base.

11. The heat dissipation device of claim 1, wherein the base further comprises four ears located at four corners thereof for extension of screws therethrough.

12. The heat dissipation device of claim 2, wherein the heat absorbing plate comprises a main body which is a square body having two neighboring corners perpendicularly cut off.

13. A heat dissipation device comprising:
a heat absorbing plate for thermally engaging with a heat generating electronic device;
a base thermally attached on a top face of heat absorbing plate;
a plurality of fins arranged on a top face of the base; and
a heat pipe having two straight sections extending through the fins, a substantially U-shaped section thermally sandwiched between the base and the heat absorbing plate, and two arced sections interconnecting two ends of the U-shaped section with the straight sections.

14. The heat dissipation device of claim 13, wherein the U-shaped portion of the heat pipe comprises two substantially parallel evaporating sections and an arced connecting section interconnecting the two evaporating sections, the two straight sections functions as condensing sections parallel to the evaporating sections of the heat pipe, and the arced sections are adiabatic sections of the heat pipe.

15. The heat dissipation device of claim 14 further comprising a U-shaped additional heat pipe, wherein the additional heat pipe has a condensing portion located between the two condensing sections of the heat pipe, an evaporating portion located between the two evaporating sections of the heat pipe, and an arced adiabatic portion located between the two adiabatic sections of the heat pipe.

16. The heat dissipation device of claim 15, wherein the condensing sections of the heat pipe and the condensing portion of the additional heat pipe are parallel to each other and in a horizontal plane, the evaporating sections of the heat pipe and the evaporating portion of the additional heat pipe are parallel to each other and in another horizontal plane, which is parallel to the base.

17. The heat dissipation device of claim 16, wherein the evaporating sections of the heat pipe and the evaporating portion of the additional heat pipe are sandwiched between the base and the heat absorbing plate, the condensing sections of the heat pipe and the condensing portion of the additional heat pipe extends above the base for engaging with the fins, the adiabatic sections of the heat pipe and the adiabatic portion of the additional heat pipe are located at a lateral side of the base, and the connecting section of the heat pipe is positioned at an opposite lateral side of the base.

18. The heat dissipation device of claim 16, wherein a distance between the two condensing sections is larger than that between the two evaporating sections of the heat pipe, two planes defined by the two adiabatic sections of the heat pipe define an acute angle therebetween, another plane defined by the adiabatic portion of the additional heat pipe is perpendicular to the base.

19. The heat dissipation device of claim 13, wherein the base further comprises an ear located at each corner thereof for extending a screw therethrough.

* * * * *